United States Patent [19]

Freiday et al.

[11] 4,253,155
[45] Feb. 24, 1981

[54] SELF-COMPENSATING MEASUREMENT SYSTEM

[75] Inventors: Robert A. Freiday; Robert L. Hanson, both of Howell Township, Monmouth County; David A. Pezzutti, Middletown Township, Monmouth County, all of N.J.

[73] Assignee: Bell Telephone Laboratories, Incorporated, Murray Hill, N.J.

[21] Appl. No.: 7,923

[22] Filed: Jan. 31, 1979

[51] Int. Cl.³ .................................. G01R 35/00
[52] U.S. Cl. .................... 364/571; 364/573; 364/580; 324/130
[58] Field of Search .......... 364/481, 571, 573, 579, 364/580; 324/130; 325/67, 363; 340/347 CC

[56] References Cited

U.S. PATENT DOCUMENTS

| 3,541,320 | 11/1970 | Beall | 340/347 CC |
|---|---|---|---|
| 3,842,247 | 10/1974 | Anderson | 364/481 |
| 3,939,332 | 2/1976 | Williams, Jr. et al. | 364/571 |
| 4,031,630 | 6/1977 | Fowler | 364/571 |
| 4,088,951 | 5/1978 | Fletcher et al. | 324/130 |
| 4,150,433 | 4/1979 | Kaniel | 364/571 |
| 4,161,782 | 7/1979 | McCracken | 364/571 |

FOREIGN PATENT DOCUMENTS 2806655 8/1978 Fed. Rep. of Germany ......... 364/571

OTHER PUBLICATIONS

EDN–Software Calibration Reduces A/D Errors by F. Gutman, Jan. 5, 1979, pp. 58–62.

Primary Examiner—Charles E. Atkinson
Assistant Examiner—Gary Chin
Attorney, Agent, or Firm—Thomas Stafford

[57] ABSTRACT

Compensation for errors in an amplitude conversion system caused by inaccuracies in and nonlinearities of system circuit components is realized by employing a self-compensation process in an amplitude measurement system (FIG. 1). In one embodiment first and second reference signals (from 111) are controllably supplied (under control of 105 via A1, A2, SW1, SW2, 108, 112, 113 and 103) to a RMS-LOG converter circuit (104) to obtain a measure of the amplitudes of the reference signals (TA, TB) and convert the amplitudes into pulse signals. The pulse signals are supplied to a control circuit (105) for conversion into digital form and storage as reference numbers for future use. A test signal supplied from a remote location over a facility under evaluation is supplied (via T, R, 101, 102, 103) to the RMS-LOG converter (104) where the test signal amplitude (TMEAS) is measured and converted into a pulse signal. In turn, the test pulse signal (TMEAS) is supplied to the control circuit (105), converted into digital form and used in conjunction with the prior stored reference numbers (TA, TB) and prescribed constants in a first prescribed compensation process to generate an output signal (TCORR) representative of the test signal amplitude (TMEAS) compensated for measurement system errors.

In another embodiment at least first, second and third reference signals (TA, TB, TC) are employed in conjunction with a test signal measurement (TMEAS) in a second prescribed compensation process to compensate test signal measurements for high order deviations from linearity.

10 Claims, 8 Drawing Figures

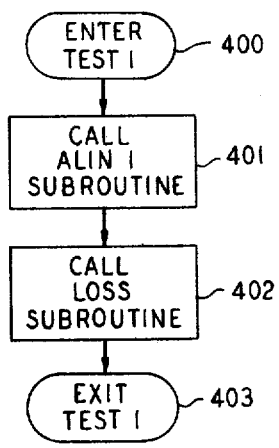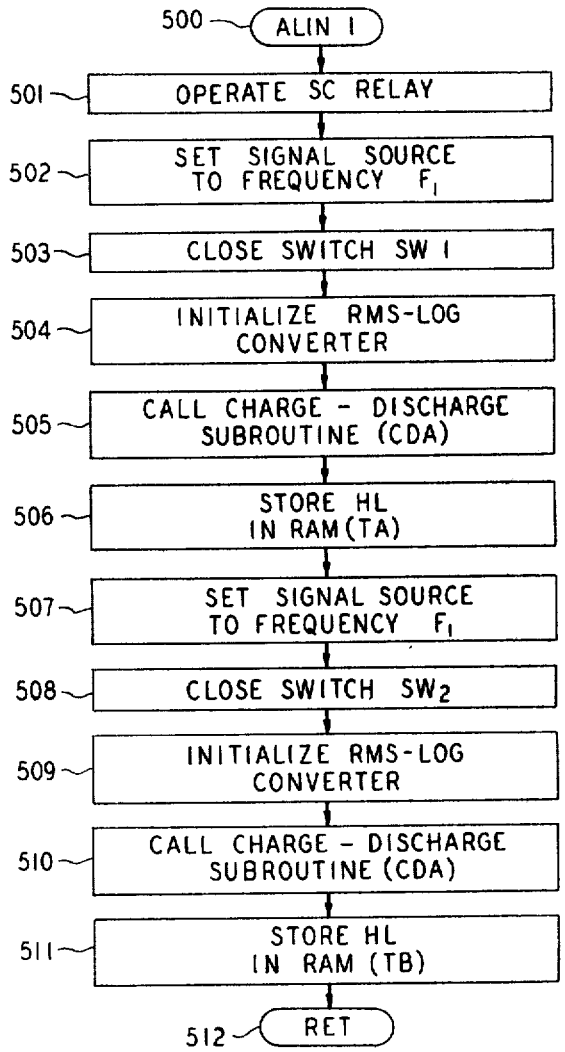

SELF-COMPENSATING MEASUREMENT SYSTEM

TECHNICAL FIELD

This invention relates to conversion systems and, more particularly, to a measurement system including amplitude conversion having self-compensation for possible circuit errors.

BACKGROUND OF THE INVENTION

In many systems it is important to obtain an accurate measure of the amplitude of incoming signals. This is especially true in test systems, for example, those employed to evaluate transmission facility characteristics.

Of particular interest are measurement circuits employed in responder apparatus used to evaluate characteristics of telecommunications transmission facilities. Prior known responder apparatus are employed to obtain measurements of, for example, loss, low level loss and various noise characteristics of telephone trunk facilities. To this end, responder receiver units employ a measurement circuit which includes an amplitude conversion circuit for obtaining a measure of the amplitude of incoming signals and for facilitating transmission of the measurement result to remote locations. Typically a test signal for the particular test being run is transmitted from a first location at one end of a transmission facility under evaluation and is received at a second location. The amplitude of the received signal is measured, converted into digital form by employing an amplitude to pulse width conversion and is utilized as desired. Usually, the measurement result is transmitted to the first location.

In order to obtain accurate measurements of the characteristics being evaluated, the prior known responder measurement circuits used extremely precise circuit components and complex circuit designs which required precise manual adjustment to compensate for nonlinearities of the circuit components in order to insure accurate amplitude measurements and conversion. The manual adjustment of the prior measurement circuits to obtain reasonable precision of measurement is usually done on installation of the equipment and periodically thereafter. Indeed, use of precision circuit components, complex circuit designs and manual adjustment of the circuits is undesirable from an economic standpoint. Such adjustment still does not compensate for ongoing variations caused by component aging and environmental changes.

In one known computer controlled test system, for example as disclosed in U.S. Pat. No. 3,842,247 issued to T. C. Anderson on Oct. 15, 1974, an attempt is made toward minimizing the affects of test system characteristics by employing a so-called calibration run prior to a test run. The calibration run, however, only compensates at a single amplitude level and still requires the use of a precision test signal generator and a precision measurement circuit in the receiver. Thus, T. C. Anderson, in his prior computer controlled arrangement, is not concerned with compensating amplitude measurement results for possible errors over an entire amplitude range.

SUMMARY OF THE INVENTION

Inaccuracies in a resulting signal measurement caused by nonlinearities and lack of precision in an amplitude conversion system and other problems are overcome by employing a self-compensating amplitude conversion arrangement in the measurement system.

To this end, a plurality of reference signals having prescribed frequencies and prescribed amplitudes are controllably supplied to an amplitude measurement circuit. The amplitude of each reference signal is measured, converted into digital form and utilized as a parameter in a predetermined process to compensate the amplitude measurement of an incoming signal for measurement system inaccuracies and nonlinearities.

In one embodiment of the invention first order inaccuracies and nonlinearities are compensated by utilizing at least first and second reference signals having at least a first frequency and at least first and second predetermined amplitudes, respectively, defining a linear amplitude conversion characteristic. The reference signals are individually supplied to the measurement and amplitude conversion circuit. The amplitude of each reference signal is measured and converted into a pulse signal having a width proportional to the amplitude. In turn, the pulse signal is converted into a binary number and stored for future use in the compensation process. This amplitude to binary number conversion procedure is continuously iterated during idle intervals of the measurement system. Thus, the stored reference numbers are continuously updated and inaccuracies and nonlinearities possibly caused by ongoing variations in circuit component values are continuously compensated. The binary reference amplitude numbers are used in a first predetermined process to compensate errors in the amplitude conversion in measuring an incoming test signal. Specifically, the amplitude of an incoming test signal from a remote location transmitted over a facility under evaluation is also measured and converted into a pulse signal having a corresponding width. The test signal measurement is converted into digital form and utilized with the previously measured reference amplitude numbers and prescribed constants depending on the particular test being run in a first prescribed compensation relationship to generate a corrected test output signal.

In another embodiment of the invention, higher order deviations from a linear function in the amplitude conversion process are compensated for by employing a plurality of reference signals, each having a predetermined frequency and a predetermined amplitude, in a second compensation process. Specifically, for second order deviations, again caused by nonlinearities and inaccuracies in the circuit components, and offset voltages and bias currents developed therein, at least first, second and third reference signals at a given frequency and having first, second and third predetermined amplitudes, respectively, are each supplied to the amplitude conversion circuit. The reference signal amplitudes are measured, converted into digital form and stored as reference numbers for later use in the second prescribed compensation process. Again an incoming test signal is also measured, the resulting amplitude converted into digital form, and employed with the previously measured reference numbers and prescribed constants in the second prescribed compensation process to generate a compensated test output signal.

In both embodiments the amplitude conversion compensation and measurement process are effected by a controller. Specifically, the controller controls system operation in measuring the reference signals and test signals, converting the measured signals into digital form, storing binary numbers representative of the measured signals and utilizing the stored numbers in conjunction with prescribed constants dependent on the specific amplitude conversion being performed in predetermined compensation processes to yield compensated amplitude measurement values.

BRIEF DESCRIPTION OF THE DRAWING

These and other objects and advantages of the invention will be more fully understood from the following detailed description of an illustrative embodiment thereof taken in connection with the appended drawings, in which:

FIG. 4 is a flowchart illustrating a sequence of steps for obtaining a compensated test measurement;

FIG. 5 is a flowchart illustrating a sequence of steps employed in the alignment subroutine shown in FIG. 4;

DETAILED DESCRIPTION

Figure 1:
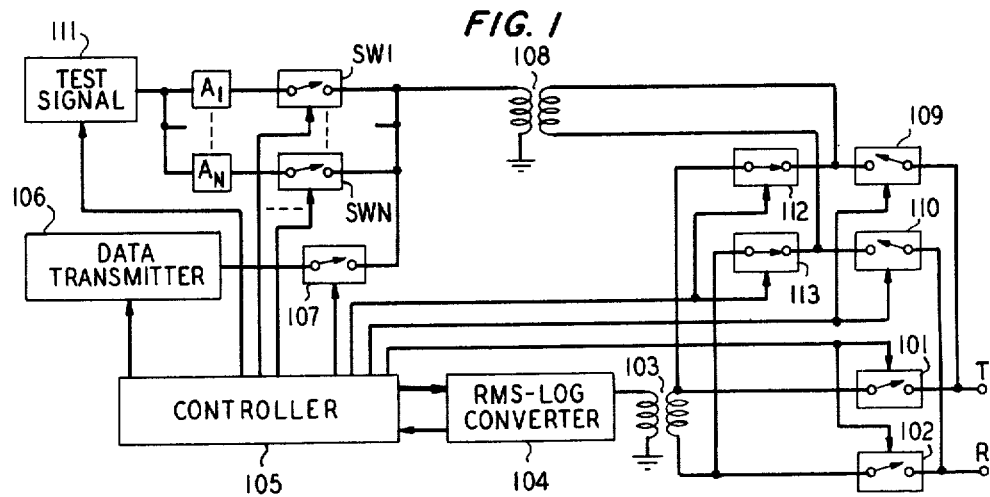
FIG. 1 shows in simplified block diagram form a measurement arrangement including in accordance with the invention an amplitude converted having self-compensation for possible errors caused by system components.
Figure 2:
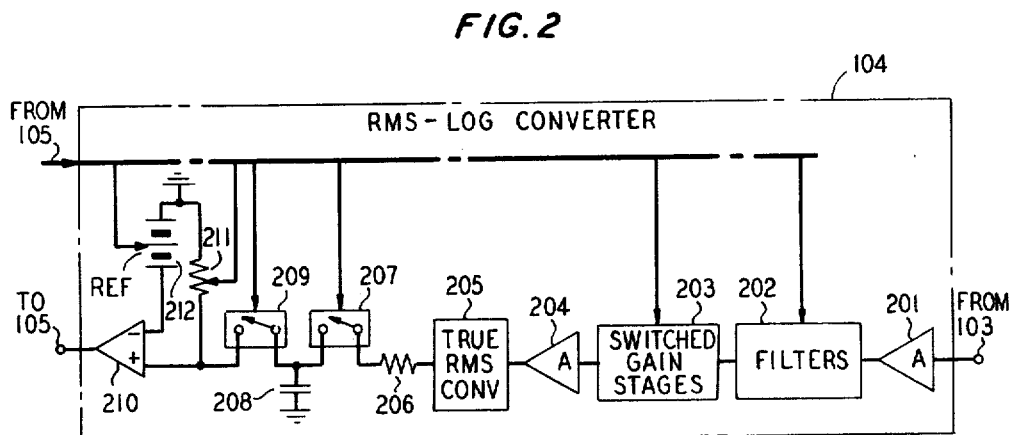
FIG. 2 depicts in simplified form details of the RMS-LOG converter employed in the embodiment shown in FIG. 1.

FIG. 1 shows in simplified block diagram form a measurement system including an embodiment of the invention. Incoming signals to be measured are supplied via terminals T and R, receive (RCV) switching elements 101 and 102 and coupling transformer 103 to RMS-LOG converter 104. Terminals T and R correspond, for example, to the tip (T) and ring (R) leads of a 2-wire telecommunications transmission facility. In this example, RCV switching elements 101 and 102 are relays and are controlled by signals from controller 105. RMS-LOG converter 104 is an amplitude to pulse width converter employed to measure and convert the amplitude of signals supplied thereto into pulse signals having widths proportional to the true root mean square (RMS) value in dB of the received signal amplitude. RMS-LOG converter 104 is also under control of signals from controller 105. Details of RMS-LOG converter 104 are shown in FIG. 2 and described below.

Pulse signal outputs from RMS-LOG converter 104 are supplied to controller 105. Controller 105 is employed to control operation of the measurement system for generating an accurate representation of the amplitudes of received signals. Specifically, as will be apparent from the following description, controller 105 obtains an amplitude measurement of an incoming test signal and compensates that measurement in accordance with a prescribed compensation process to minimize inaccuracies and nonlinearities in conversion of the amplitude measurement caused by the receiver circuit components, for example, converter 104 and transformers 103 and 108. Thereafter, the compensated measurement result is transmitted under control of signals from controller 105 to a remote location via data transmitter 106, transmitter switching element 107, coupling transformer 108, and transmit (XMT) switching elements 109 and 110, terminals T and R, and the communications facility under evaluation (not shown), for example, a 2-wire telephone trunk to a remote location. In this example, the switching elements are relays.

Figure 3:
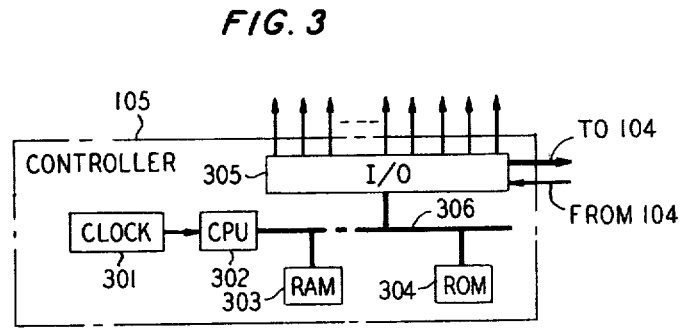
FIG. 3 shows in simplified form details of the controller arrangement employed in the embodiment shown in FIG. 1.

During idle intervals of the measurement system, i.e., no incoming signals or tests being performed, a so-called self-check or self-compensation mode of the measurement conversion system is continuously in operation. In the appended program listing this mode of operation is labeled ALIN. To this end, a reference signal from test signal source 111 is supplied under control of signals from controller 105 via selected ones of attenuators A1 through AN by enabling corresponding ones of switching elements SW1 through SWN, respectively, coupling transformer 108, self-check switching elements (SC) 112 and 113, and coupling transformer 103 to RMS-LOG converter 104. The signals supplied via attenuators A1 through AN are reference signals having a predetermined frequency and predetermined amplitudes. The reference signal amplitudes are measured and converted into pulse signals via RMS-LOG converter 104. The pulse signals are supplied to controller 105, converted into digital form and stored as reference numbers in controller 105 for future use in compensating an amplitude measurement of an incoming test signal. Details of controller 105 are shown in FIG. 3 and discussed below.

Data transmitter 106 is controlled by controller 105 to generate a typical frequency shift (FS) data signal, namely, a guard (1200 Hz)-data (2200 Hz)-guard (1200 Hz) signal.

Test signal source 111 is a precision stable test signal source capable of supplying signals at predetermined frequencies at a prescribed amplitude under control of controller 105. In this example, source 111 is the best signal source commonly referred to as a milliwatt supply and used in telecommunications test systems. Specifically, source 111 generates a reference signal at a predetermined amplitude having an accuracy, in this example, of $\pm 0.025$ dBm at 600 ohms over a temperature range of approximately 0 degrees to 50 degrees C. at any one of a plurality of frequencies. The test signal frequency has an accuracy of approximately 300 parts per million. Similarly, attenuators A1 through AN are also precision circuit elements and are set at prescribed values having an accuracy of within $\pm 0.005$ dB and remain stable to within $\pm 0.02$ dB over an extended time interval. This degree of precision in the signal source and attenuators is required to avoid introducing an absolute error in the measurement resulting from the compensated amplitude conversion process in the test arrangement. Although in this example test signal source 111, attenuators A1 through AN, and switching elements SW1 through SWN are shown as individual elements, they may be incorporated into what is now commonly referred to as a programmable test signal source.

FIG. 2 shows in simplified form details of RMS-LOG converter 104. Accordingly, incoming signals are supplied from transformer 103 (FIG. 1) via input amplifier 201, filters 202, switched gain stages 203 and buffer amplifier 204 to true RMS converter 205. Amplifier 201 typically has a fixed gain of, for example, 20 dB. A particular one of filters 202 and switched gain stages 203 are selected under control of controller 105, dependent on the particular test being performed and the compensation procedure being run. For a loss test, by way of example, a high-pass filter is selected in filters 202 and a gain stage of 0 dB in switched gain stages 203. Other tests, for example low level loss, C-message noise and C-notch noise, employ other filters and gain stages as would be apparent to those skilled in the art. True RMS converter 205 is employed to convert the amplitude of the incoming signal to a direct current potential representative of the true root mean square (RMS) value thereof. In one example from experimental practice, an Analog Device RMS converter AD536KD is employed to generate the desired true RMS output signal. The direct current output from true RMS converter 205 is controllably supplied under control of controller 105 via charge resistor 206 and switching element 207 to hold capacitor 208. Similarly, a potential developed across capacitor 208 is controllably supplied under control of controller 105 via switching element 209 to one input, i.e., the noninverting (+) input of comparator 210. Adjustable resistor 211 is also connected between the noninverting input of comparator 210 and a reference potential point, namely, ground potential. The resistance value of resistor 211 is controllably selected by controller 105 dependent on the particular test being run. Similarly, adjustable reference potential source 212 is connected between the inverting (−) input of comparator 210 and a reference potential point, for example, ground potential. Reference potential source 212 is also selected under control of controller 105 dependent upon the particular test being run. While both adjustable resistor 211 and adjustable reference potential source 212 are shown as being continuously adjustable, in practice fixed potentials are switched into the corresponding circuits, again under control of controller 105. The value selected for resistor 211 and the value of reference potential source 212 determines the discharge time constant of capacitor 208 and the switching point of comparator 210, respectively. This, in turn, determines the amplitude to pulse width conversion function. Since the discharge characteristic of capacitor 208 and resistor 211 is an exponential function, the width of an output pulse from comparator 210 is proportional in dB to the true RMS amplitude value of incoming signals generated by converter 205. Pulse signal outputs from comparator 210 are supplied to controller 105. It is noted that the circuit components of converter 104 are not extremely precise elements. This is possible because of the unique compensation process performed in the amplitude conversion in accordance with an aspect of the invention. Additionally, nonlinearities and inaccuracies in the converter components as well as other system components, for example, transformers 103 and 108, are also compensated in accordance with an aspect of the invention.

FIG. 3 shows in simplified block diagram form details of controller 105. Accordingly, shown are clock circuit 301, central processor unit (CPU) 302, read-write memory unit, commonly referred to as random access memory (RAM) 303, read-only memory (ROM) 304, and input/output unit (I/O) 305. CPU 302, RAM 303, ROM 304 and I/O 305 are interconnected via bus 306 to form a microcomputer system. Clock 301 generates timing signals for CPU 302. In an example from experimental practice, the frequency of the timing signal generated by clock 301 is 4 MHz.

Any of several arrangements now commercially available may be employed to realize a desired implementation of controller 105. In an example from experimental practice, an Intel 8085 CPU and compatible associated circuit elements have been employed. The Intel 8085 and its operation is described in "MCS 85 User's Manual" published by Intel and dated March 1977, while programming of the Intel 8085 is described in the "Intel 8080/85 Assembly Language Programming Manual" dated 1977. It is also noted that a CPU unit, RAM memory, ROM memory and I/O unit are available packaged as a single unit, for example, the Intel 8048 or similar units.

CPU 302 includes a plurality of working registers which are employed in the amplitude conversion and compensation process as indicated in the appended listing, namely registers A, B, C, D, E, H and L. The amplitude conversion compensation and measurement routines to be described below are stored in ROM 304.

Operation of controller 105 in controlling the measurement system to effect an accurate measure of received signals including a first amplitude conversion compensation process in accordance with an aspect of the present invention is described in a digital program listing shown in the Appendix. This program listing, written in assembly language for the Intel 8085 microprocessor, is by way of example only and is not intended to limit the scope of the invention. The program is descriptive of the set of electrical control signals that serve to configure controller 105 into a machine capable of controlling circuit elements and arrangements of the measurement system in accordance with an aspect of the invention to generate an accurate amplitude conversion in the measurement of incoming test signals. The program listing and, hence, operation of controller 105 to control the measurement system elements, in accordance with an aspect of the invention, is more readily understood with the aid of the flowcharts shown in FIGS. 4 through 8. The flowcharts can be seen to include three different symbols. The oval symbol indicates the beginning and end of the routine. The rectangular symbols, commonly referred to as operation blocks, contain the description of a particular detailed operational step. The diamond symbols, commonly referred to as conditional branch points, contain a description of a test peformed by the microcomputer for enabling it to determine the next operation to be performed. By way of an example to illustrate the operation of an embodiment of the invention, a loss measurement including amplitude conversion compensation is described.

In one specific embodiment of the invention first and second reference signals are employed, i.e., N=2. A first reference signal designated TA from source 111 having a first predetermined frequency, for example, 1000 Hz is supplied under control of controller 105 via attenuator A1 having an attenuation of 0 dB. Similarly, a second reference signal designated TB from source 111 also having a frequency of 1000 Hz is supplied via attenuator A2 having a predetermined attenuation value in this example 15 dB. The first and second reference signals are individually supplied via transformer 108, switching elements 112 and 113 and transformer 103 to RMS-LOG converter 104. The individual reference signal amplitudes TA and TB are measured, converted into digital form and stored as reference numbers in controller 105 for future use.

This compensation technique employing first and second reference signals assumes a linear relationship which is valid to a first approximation. It can be readily shown that for a first order, i.e., linear, compensation in a measurement system including an amplitude conversion the compensation process is of the form $$TCORR = K - \frac{K_1 (TA - TMEAS)}{TA - TB} \quad (1)$$

where TCORR is a compensated version of an incoming test signal amplitude measurement expressed in milliseconds, TMEAS is the amplitude of an incoming test signal, TA is the amplitude of the first reference signal expressed in milliseconds, TB is the amplitude of the second reference signal expressed in milliseconds, K and $K_1$ are factors dependent on the type of test being run, i.e., loss, low level loss, noise, C-message noise, C-notch noise, or the like. In the program listing shown in the Appendix, K is expressed as $K2+K3-K4$. The reason for this is to simplify the program to allow appropriate factors to be inserted dependent on the particular test to be run.

In an example from experimental practice for loss measurements a signal supplied from test signal source 111, designated first reference signal TA, is attenuated via attenuator A1 by 0 dB. First reference signal TA has a predetermined precise amplitude which ideally should generate a pulse signal output from RMS-LOG converter 104 having a width of 319 milliseconds. Subsequently, the test signal from source 111 is attenuated by attenuator A2 by 15 dB and is designated second reference signal TB. Second reference signal TB ideally should generate a pulse output from converter 104 having a width of 19 milliseconds. Therefore, in this example for a loss test, Equation 1 becomes $$TCORR = 319 - \frac{300(TA - TMEAS)}{(TA - TB)} \quad (2)$$

Thus, operation of the circuit is to obtain a measure of first reference signal TA, obtain a measure of second reference signal TB, obtain a measure of incoming test signal TMEAS, convert the measured results to digital form, insert those measured values in Equation 2 along with prescribed constants K and $K_1$, and generate compensated output pulse signal TCORR.

Operation of controller 105 in controlling the measurement and amplitude conversion system to effect this compensated measurement is shown by flowcharts in FIGS. 4–8. Accordingly, FIG. 4 shows a flowchart of a main program for effecting the particular test to be run, in this example designated TEST 1. As indicated above, TEST 1 is, by way of example only, a loss measurement. The loss measurement routine in entered at oval 400.

Operation block 401 indicates that an alignment (ALIN1) subroutine is called to obtain reference numbers TA and TB as described above in order to later effect compensation of an incoming test signal and generate an accurate amplitude conversion and measurement of that signal. Although the flowchart indicates a call of ALIN1, it is noted that all alignment subroutines are run continuously during idle intervals, i.e., in so-called "background" of the measurement system, and reference numbers are continuously updated in memory locations in RAM 303 (FIG. 3). Therefore, in accordance with an aspect of the invention, instantaneous variations in receiver component values because of aging, temperature variations and the like are taken into consideration and possible errors in the amplitude conversion and measurement are minimized. The ALIN1 subroutine is described below.

Once the alignment reference numbers are stored in RAM memory 303 control is transferred to operation block 402 which calls for the TEST 1 subroutine, in this example, a loss measurement. The loss subroutine obtains a measure of a specific incoming signal transmitted from a remote end of a facility under evaluation, for example a telephone trunk. Measured value TMEAS of the incoming signal is obtained and employed in conjunction with the reference numbers to obtain an accurate measure, i.e., TCORR, of the particular characteristic of the facility under evaluation, in this example a loss measurement at 1000 Hz. Once TCORR is transmitted to the remote location or otherwise utilized as desired the test subroutine is exited via oval 403.

FIG. 5 shows a flowchart of alignment subroutine ALIN1 which is entered via oval 500.

Operation block 501 causes self-check switches (SC) 112 and 113 (FIG. 1) to be enabled and test signal source 111 is connected via individual attenuators A1 and A2 and switches SW1 and SW2, respectively, through transformers 108 and 103 to RMS-LOG converter 104. Only one of switches SW1–SWN is enabled at any time. Thus, an alignment loop or compensation loop is established. As noted above, the alignment routines are continuously run during idle intervals of the measurement system. In this example from experimental practice, two signal levels are employed, i.e., $N=2$, $A1=0$ dB and $A2=15$ dB.

Operation block 502 causes the frequency of test signal source 111 to be set to F1, in this example, 1000 Hz.

Operation block 503 causes switch SW1 to close thereby supplying signal F1 at 0 dB via A1, transformer 108, switches 112 and 113, and transformer 103 to RMS-LOG converter 104.

Operation block 504 initializes RMS-LOG converter 104 for the specific alignment subroutine relating to the specific test routine being run, in this example, ALIN1 relating to TEST 1. Specifically, a particular one of filters 202 is selected, a specific stage of switched gain stages 203 is selected, a specific discharge resistance value for resistor 211 is selected, and a specific reference potential value for reference potential source 212 is selected as described above.

Operation block 505 calls the charge-discharge subroutine for ALIN1 labeled CDA. As discussed below, the charge-discharge subroutine CDA generates alignment (reference) numbers designated HL to be employed in the compensation process to correct for possible amplitude conversion errors and generate a compensated measurement value. The amplitude value of the test signal at 0 dB designated first reference signal TA is converted to a pulse width via RMS-LOG converter 104 and supplied to controller 105 where it is converted into digital form and stored as a first reference number in registers designated HL in RAM 303 (operation block 506). As indicated below, the last operation in the charge-discharge subroutine is to return signal switching to normal. Consequently, the above operation, except SC relay block 501, is repeated for measurement of the second reference signal. Thus, operation block 507 causes signal source 111 to again be set to frequency F1, i.e., 1000 Hz. Operation block 508 causes switch SW2 (N=2) to be closed thereby supplying the test signal F1 at −15 dB to RMS-LOG converter 104.

Operation block 509 initializes RMS-LOG converter 104 as discussed above in relation to operation block 504.

Operation block 510 again calls the charge-discharge subroutine for ALIN1 and causes an alignment reference signal TB to be measured by converter 104 and converted into digital form by controller 105.

Operation block 511 causes HL representing TB to be stored in RAM memory as a second reference number for later use in obtaining a compensated value for the amplitude conversion and measurement in the loss test.

Control is thereafter returned via oval 512 to the main program routine.

Figure 6:
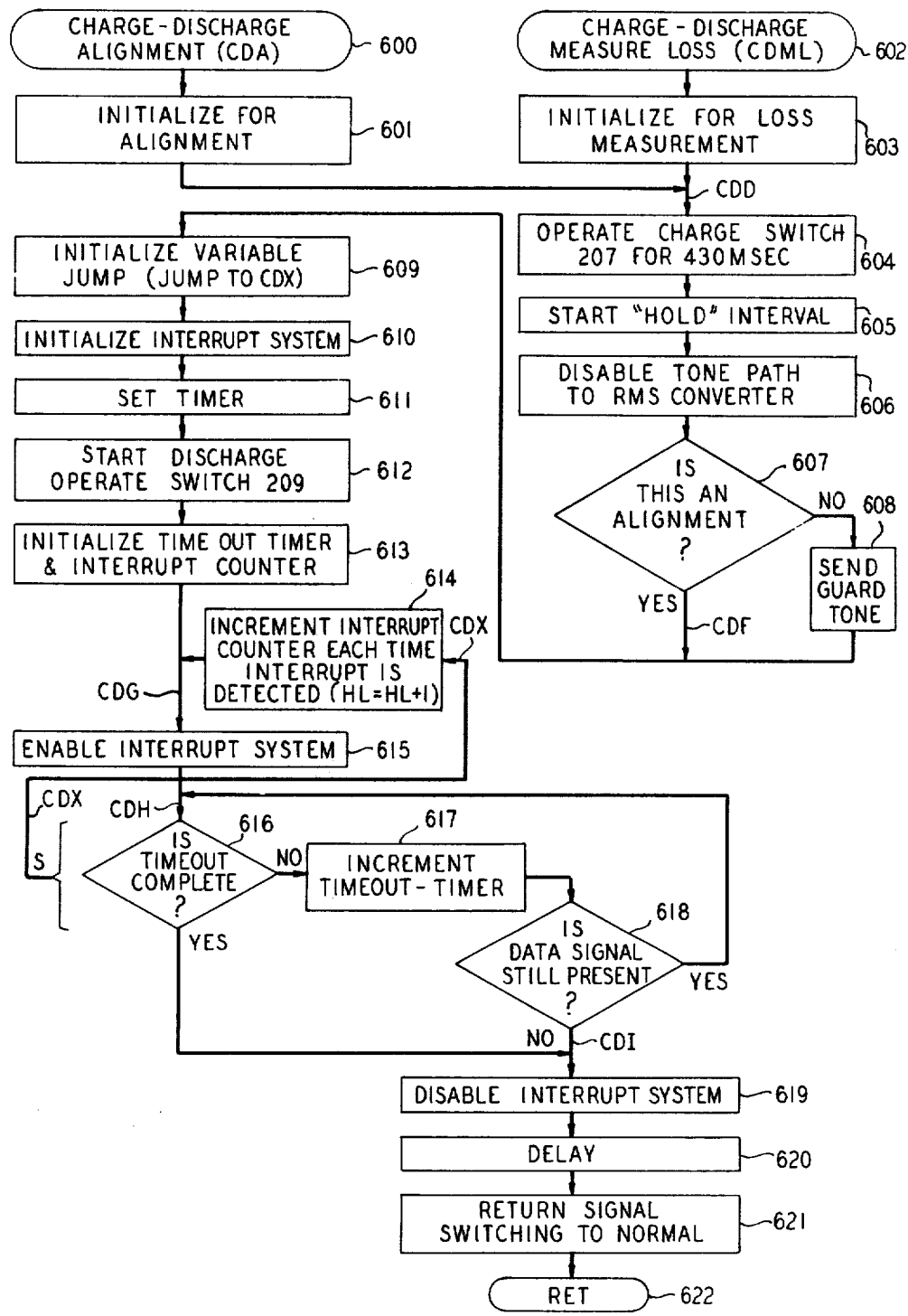
FIG. 6 is a flowchart which illustrates the sequence of steps employed in the charge-discharge subroutine utilized in the flowchart shown in FIG. 5.

FIG. 6 shows the charge-discharge subroutine for both alignment (compensation) designated CDA and for measuring loss designated CDML.

Thus, during the alignment (compensation) process the charge-discharge routine is entered via oval 600.

Operation block 601 initializes the subroutine for an alignment (compensation) run. This merely indicates that guard tone is not sent later in operation block 608. Thereafter, control is transferred to label CDD.

When a loss measurement is being run, i.e., TMEAS being obtained, the charge-discharge subroutine is entered via oval 602 (CDML).

Then, operation block 603 initializes the subroutine for a test run, i.e., loss measurement in this example. This indicates that the test result in conditional branch point 607 is NO and guard tone is sent via operation block 608 to maintain proper system timing. Thereafter, control is transferred to label CDD.

Operation block 604 causes charge switch 207 in RMS-LOG converter 104 to be closed for 430 milliseconds.

Operation block 605 causes the hold interval to be started, i.e., switches 207 and 209 are both open.

Operation block 606 causes the signal path to true RMS converter 205 to be disabled.

Conditional branch point 607 tests to determine if this is an alignment process. If YES, control is transferred to label CDF. If NO, then it is a measurement run and control is transferred to operation block 608 which initiates sending guard tone via data transmitter 106 for data transmission in order to keep system timing correct.

Operation block 609 initializes a variable jump designated JUMP to CDX to be discussed below.

Operation block 610 initializes the interrupt system of 200 microseconds.

Operation block 611 initializes a programmable timer to an interval of 200 microseconds.

Operation block 612 starts the discharge of capacitor 208 by operation of switch 209.

Operation block 613 initializes a 500 millisecond timeout timer and an interrupt counter.

Operation block 615, labeled CDG, enables the interrupt system.

Conditional branch point 616, labeled CDH, tests to determine if a 500 millisecond timeout interval is complete. If YES, control is transferred to label CDI. If NO, control is transferred to operation block 617.

Briefly, as indicated above, the variable jump is effected every time an interrupt is detected. Upon detecting an interrupt the program jumps to label CDX and control is transferred to operation block 614.

Operation block 614 increments the interrupt counter, i.e., HL is updated to HL+1. Control is thereafter transferred to lable CDG and the program continues as described above.

Returning to the NO test result of branch point 616, control is transferred to operation block 617.

Operation block 617 increments the 500 millisecond timeout timer. Thereafter control is transferred to branch point 618.

Branch point 618 tests to determine if the data signal is still present. If NO, control is transfered to label CDI. If YES, control is transferred to label CDH and the above process is iterated.

Once the data signal is no longer present control is transferred to operation block 619 and the interrupt system is disabled.

Operation block 620 interposes a delay to allow for the complete discharge of charge-discharge capacitor 208.

Operation block 621 causes the signal switching in the measurement system to return to normal.

Thereafter control is returned to the main routine via oval 622.

Figure 7:
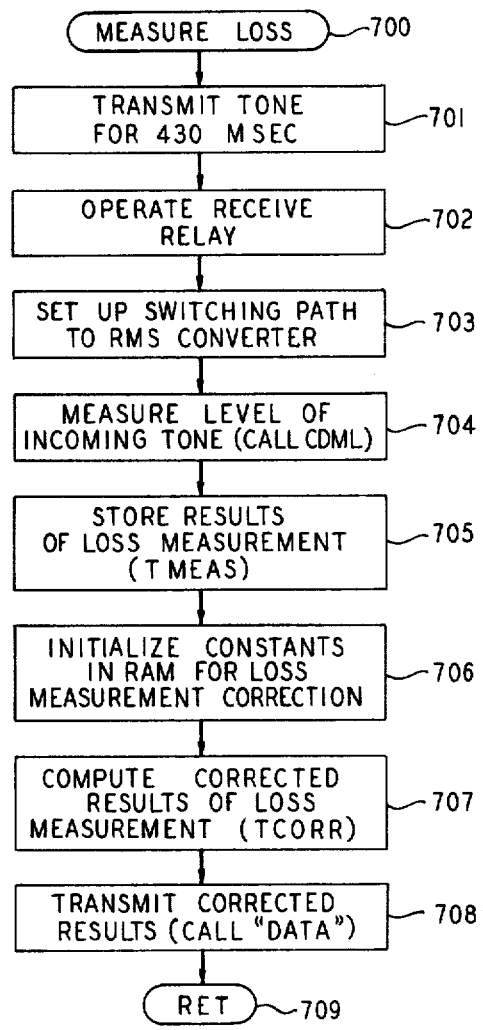
FIG. 7 is a flowchart illustrating a sequence of steps employed in generating a compensated test result, in this example a loss test result, utilized as a step in FIG. 4.

FIG. 7 shows a flowchart of a loss measurement subroutine which is entered via oval 700.

Operation block 701 calls for the transmission of a test tone from source 111 via switch SW1, transformer 108 and transmit switching elements 109 and 110 (closed by operation of the transmit relay) and over the facility under test to the remote location for an interval of 430 milliseconds.

Thereafter the transmit relay is disabled and the receive relay is enabled thereby connecting the facility under evaluation via receive switching elements 101 and 102 and transformer 103 to RMS-LOG converter 104.

Operation block 703 sets up the switching path and initializes RMS-LOG converter 104 for a loss test as discussed above.

Operation block 704 causes the amplitude level of an incoming test signal to be measured. This is effected by calling the charge-discharge subroutine for the loss measurement label CDML described above in relation to FIG. 6.

Operation block 705 causes the results of the loss measurement to be stored, namely, a value for TMEAS, for later use.

Operation block 706 initializes RAM memory for loss measurement correction.

Operation block 707 causes a corrected measurement result to be computed, namely, TCORR.

Operation block 708 causes the corrected measurement result to be transmitted to a remote location by calling the data subroutine discussed below in relation to FIG. 8. Thereafter control is returned to the main program via oval 709.

Figure 8:
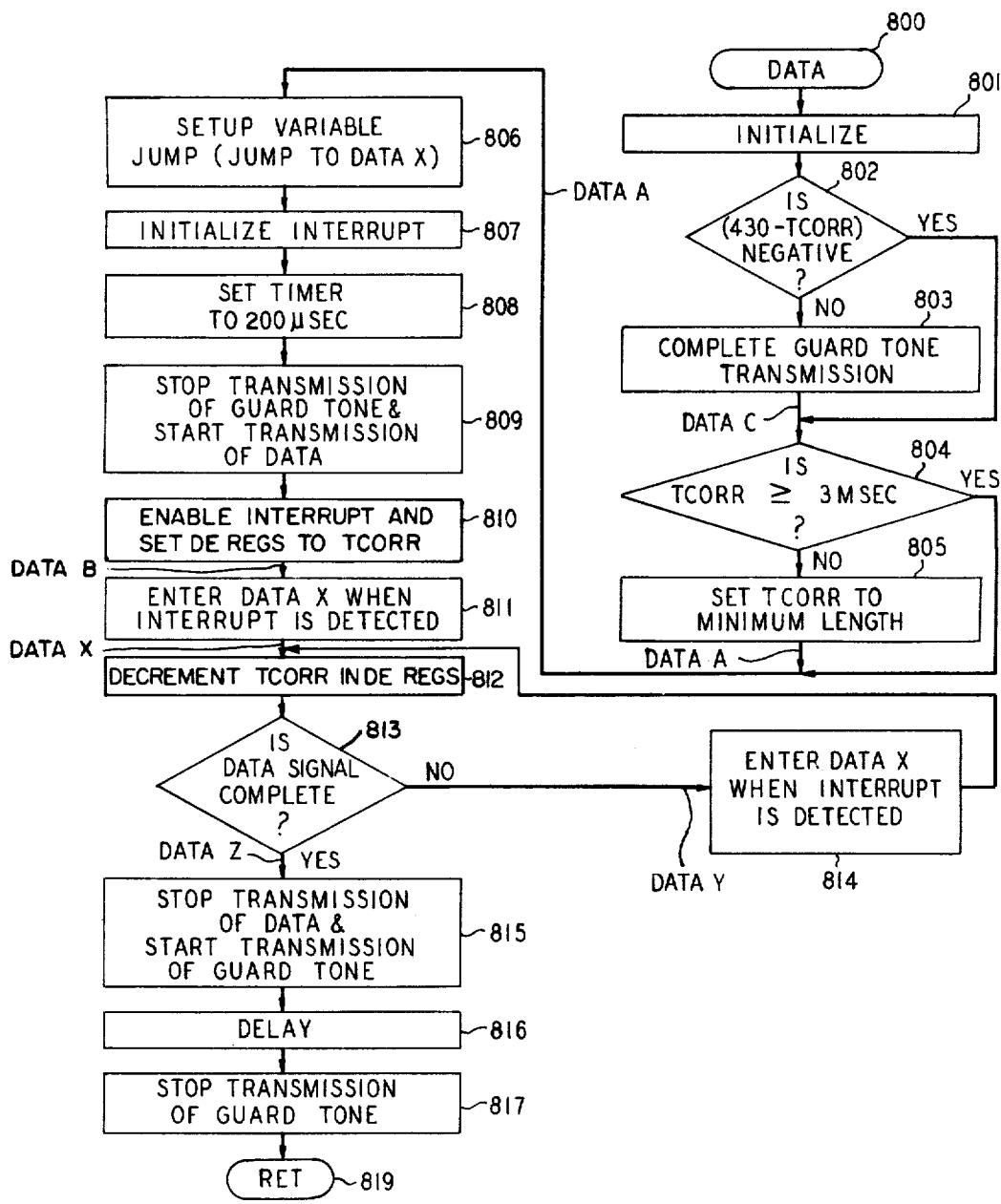
FIG. 8 is a flowchart illustrating a sequence of steps employed in the data subroutine utilized as a step in the flowchart of FIG. 7.

FIG. 8 depicts a flowchart of the data subroutine which is entered via oval 800.

Operation block 801 initializes the data subroutine. Thereafter control is transferred to conditional branch point 802.

Conditional branch point 802 tests to determine if the function 430-TCORR is negative. As discussed above in the charge-discharge subroutine, sending of guard tone is initiated during the loss measurement charge-discharge subroutine CDML in order to maintain correct system timing. The guard signal is typically transmitted for 430 milliseconds. Thus, this test determines whether or not the guard signal has been sent for the minimum length of 430 milliseconds. If the test result is NO control is transferred to operation block 802 and the guard tone is transmitted for the desired interval. If the test result is YES, guard tone has been transmitted for a sufficient interval and control is transferred to label DATAC.

Conditional branch point 804 tests to determine if the pulse width of the corrected signal TCORR is equal to or greater than a prescribed minimum interval, namely, 3 milliseconds. If the test result is NO control is transferred to operation block 805 and TCORR is set to the prescribed minimum pulse width of 3 milliseconds. Thereafter, control is transferred to label DATAA. If the test result is YES, control is transferred directly to label DATAA.

Operation block 806 causes a variable jump to be set to label DATAX.

Operation block 807 causes the interrupt system to be initialized.

Operation block 808 causes an interrupt clock timer to be set to 200 microseconds.

Operation block 809 causes the transmission of guard tone to stop and starts transmission of the data signal.

Operation block 810 enables the interrupt system and sets register pair D and E to the value of TCORR. Control is transferred to operation block 811 label DATAB.

Operation block 811 causes the program to enter label DATAX when an interrupt is detected.

Operation block 812 decrements the value of TCORR stored in register pair DE.

Conditional branch point 813 tests to determine if the data signal is complete, i.e., the value in register pair DE is zero (0). If YES, control is transferred to label DATAZ. If the test result is NO, control is transferred to operation block 814.

Operation block 814 DATAY causes the program to enter label DATAX when an interrupt is detected.

When the data signal transmission is completed control is transferred to operation block 815 labeled DATAZ and transmission of the data signal is stopped and transmission of the guard tone is started.

Operation block 816 causes a predetermined delay to be interposed.

Operation block 817 causes the guard tone transmission to be stopped. Consequently, the desired guard-data-guard frequency shift signal has been transmitted. Thereafter, control is transferred to the main program via oval 819.

The above amplitude conversion compensation technique employed in obtaining a loss measurement assumes a linear relationship which is valid only to a first approximation. In other amplitude conversions it is desirable to compensate for second or higher order deviations from linearity which occur because of offset voltages and bias currents developed in RMS-LOG converter 104. It is desirable in the amplitude conversion to compensate possible errors caused by variations in these parameters. Thus, another embodiment of the invention for compensating second order deviations in amplitude conversion employs at least first, second and third reference signals, i.e., N=3. Since attenuators A1 and A2 (FIG. 1) were previously employed in the first order approximation, attenuators A3, A4 and A5 are employed in this embodiment. Thus, a first reference signal, designated TA, from source 111 having a first predetermined frequency, for example, 1000 Hz, is supplied under control of signals from controller 105 via attenuator A3 having, in this example, an attenuation of 16 dB, switch SW3, transformer 108, receive switching elements 112 and 113, and transformer 103 to RMS-LOG converter 104. Similarly, a second reference signal, designated TB, is supplied from source 111 to converter 104 via attenuator A4 having, in this example, an attenuation value of 31 dB, and a third reference signal, designated TC, is supplied to converter 104 from source 111 via attenuator A5 having in this example an attenuation value of 33 dB. The first, second and third reference signals are individually supplied under control of controller 105 to converter 104 and the individual reference signal amplitudes TA, TB and TC are measured, converted to digital form, and stored as reference numbers in controller 105 for future use.

It can be readily shown that for second order compensation in the amplitude conversion process the compensation process is of the form $$TCORR = C_1 - C_2(L + \delta L) \quad (3)$$

where $C_1$ and $C_2$ are constants related to an ideal system, $$L = \frac{C_1 - TMEAS}{C_2}, \quad (4)$$

$$\delta L = a_1 + a_2 L + a_3 L^2, \quad (5)$$

$$a_1 = \frac{\Delta_1}{\Delta}, \quad a_2 = \frac{\Delta_2}{\Delta}, \quad a_3 = \frac{\Delta_3}{\Delta}, \quad (6)$$

$$\Delta = [LBx(LC)^2 + LAx(LB)^2 + (LA)^2 xLC] - [(LA)^2 xLB + (LB)^2 xLC + (LC)^2 xLA], \quad (7)$$

$$\Delta_1 = [\delta Ax LBx(LC)^2 + LAx(LB)^2 x\delta C + (LA)^2 xLCx\delta B] - [(LA)^2 xLBx\delta C + (LB)^2 xLCx\delta A + (LC)^2 xLAx\delta B], \quad (8)$$

$$\Delta_2 = [\delta Bx(LC)^2 + \delta Ax(LB)^2 + (LA)^2 x\delta C] - [(LA)^2 x\delta B + (LB)^2 x\delta C + (LC)^2 x\delta A], \quad (9)$$

$$\Delta_3 = (LBx\delta C + LAx\delta B + \delta AxLC) - (\delta AxLB + \delta BxLC + \delta CxLA), \quad (10)$$

$$LA = \frac{C_1 - TA}{C_2}, \quad (11)$$

where TA is measured at $-16$ dB, $$\delta A = (-LA), \quad (12)$$

$$LB = \frac{C_1 - TB}{C_2}, \quad (13)$$

where TB is measured at $-31$ dB, $$\delta B = (C_3 - LB), \quad (14)$$

$$LC = \frac{C_1 - TC}{C_2}, \quad (15)$$

where TC is measured at $-33$ dB, and $$\delta C = (C_4 - LC). \quad (16)$$

The above reference numbers, i.e., TA, TB and TC are continuously measured, converted into binary numbers, and stored in controller 105 to be utilized in the second amplitude compensation process to realize a compensated output result.

In a specific example, $C_1$ is 419 milliseconds, while $C_2$ is 20, $C_3$ is 15 and $C_4$ is 17. $C_1$ corresponds to an ideal pulse width with TA being supplied to converter 104. Thus, the compensation process takes the form $$L = \frac{419 - TMEAS}{20}. \qquad (17)$$

By including constants $C_1$-$C_4$ in equations 3 through 16 in conjunction with the measured reference numbers for TA, TB and TC to obtain a value of $\delta L$, a compensated, amplitude conversion value takes the form $$TCORR = [419 - 20(L + \delta L)]. \qquad (18)$$

A program to effect the above process for compensating second order deviations from a linear function would be apparent to those skilled in the art in light of the program for compensating first order deviations.

Indeed, any desired number of reference signals having a desired frequency including direct current (d.c.) and prescribed amplitude relationships may equally be employed in a self-compensating system to compensate amplitude values in a range of values for higher order deviations from linearity.

APPENDIX

```
C2      EQU     68              ;TIMER MULTIPLIER

ORG     0000H
        JMP     INIT

ORG     3CH
INTER:  INX     SP              ;REMOVE RETURN ADDRS FROM STACK
        INX     SP
        JMP     JUMP            ;GO TO VARIABLE "JMP" STATEMENT

TLOSS   CALL    ALIN1           ;LOSS
        MVI     A,0BFH
        OUT     32H
        CALL    LOSS
        LHLD    TCORR
        CALL    BCD
        NOP
        JMP     TLOSS

ALIN1:  MVI     A,0F7H          ;OPERATE THE "SC" RELAY
        OUT     32H
        CALL    MWT0            ;SETUP 1000HZ TONE SOURCE
                                ;AT 0DBM THROUGH "LOSS"
                                ;SWITCHING TO RMS CONVERTER

MVI     A,41H
        OUT     20H
        CALL    CDA             ;CHARGE-DISCHARGE
        SHLD    C1L0            ;STORE RESULTS
        CALL    MWT15           ;SETUP 1000HZ TONE SOURCE
                                ;AT -15DBM THROUGH "LOSS"
                                ;SWITCHING TO RMS CONVERTER
        MVI     A,41H
```

```
        OUT     20H
        CALL    CDA             ;CHARGE-DISCHARGE
        SHLD    C1L15           ;STORE PULSE WIDTH
        RET

LOSS:   CALL    MWT0            ;SEND MWT AT 0 DBM
        LXI     H,10            ;WAIT 10 MSEC
        CALL    TIMER
        MVI     A,0DDH          ;OPERATE THE "XMT" RELAY
                                ;AND "LOOP" RELAY
        OUT     32H
        LXI     H,430           ;SEND MWT FOR 430 MSEC
        CALL    TIMER
        MVI     A,0DBH          ;OPERATE THE "RCV" AND
                                ;"LOOP" RELAY
        OUT     32H
        NOP
        NOP
        NOP
        MVI     A,41H           ;SETUP SWITCHING PATH
                                ;TO RMS CONVERTER
        OUT     20H
        MVI     A,41H
        CALL    CDML            ;CHARGE-DISCHARGE (MEAS LOSS)
        SHLD    TMEAS
        LXI     H,3000          ;SET UP CONSTANTS USED
                                ;IN CORRECTION EQUATION
        SHLD    K1
        LXI     H,3190
        SHLD    K2
        LXI     H,0
        SHLD    K3
        CALL    K4L
        LHLD    C1L0
        SHLD    TA
        LHLD    C1L15
        SHLD    TB
        CALL    COMP            ;COMPUTE CORRECTED LOSS
        CALL    DATA
        RET
```

```
CDA:    LXI     H,TEMP      ;SET FLAG INDICATING "ALIGNMENT"
        MVI     M,0
        LXI     H,PT20      ;SAVE STATUS OF PORT 20
        MOV     M,A
        JMP     CDD
CDML:   LXI     H,TEMP      ;SET "LOSS MEAS" FLAG
        MVI     M,2
        LXI     H,PT20      ;SAVE STATUS OF PORT 20
        MOV     M,A
        MVI     A,42H       ;STOP TIMER
        OUT     30H
        MVI     A,0         ;INIT TONE SWITCHING
        OUT     21H
        OUT     22H
CDD:    LXI     H,PT20      ;OPERATE "CHARGE" SWITCH
                            ;FOR 430 MSEC
        MOV     A,M
        ORI     10H
        OUT     20H
        LXI     H,430
        CALL    TIMER
        LXI     H,PT20      ;START "HOLD" INTERVAL---
                            ;ISOLATE THE CHARGE
                            ;CAPACITOR WHILE LEAVING
                            ;THE TONE ON THE RMS
                            ;CONVERTER
        MOV     A,M
        OUT     20H
        ANI     0BFH        ;DISABLE TONE PATH TO
                            ;RMS CONVERTER WHILE
                            ;MAINTAINING DC REFERENCE
                            ;PATH
        MOV     M,A
        OUT     20H
        LXI     H,TEMP      ;IS THIS AN "ALIGNMENT"
        MOV     A,M
        CPI     0
        JZ      CDF         ;YES
        MVI     A,0DDH      ;NO,SEND GUARD TONE,
                            ;OPERATE THE "XMT" AND
                            ;"LOOP" RELAY
        OUT     32H
        CALL    T1200
```

```
CDF:    LXI     H,CDX           ;INITIALIZE VARIABLE JUMP
        SHLD    ADDRS
        CALL    SET75           ;READY THE INTERRUPT SYSTEM
        LXI     H,200           ;SET HARDWARE TIMER TO 200
        CALL    PULSE
        LXI     H,PT20          START DISCHARGE
        MOV     A,M
        ORI     20H
        OUT     20H
        NOP                     ;DELAY TO INSURE THAT THE
                                ;COMPARATOR OUTPUT WILL
                                ;BE HIGH BEFORE THE PROGRAM
                                ;ENTERS THE WAIT LOOP AT "CDA"
        NOP
        NOP
        NOP
        NOP
        NOP
        NOP
        NOP
        LXI     D,0             ;CLEAR TIMEOUT TIMER
        LXI     H,0             ;CLEAR THE INTERRUPT COUNTER
CDG:    EI                      ;ENABLE THE INTERRUPT SYSTEM
CDH:    MOV     A,D             ;IS 500 MSEC TIMEOUT COMPLETE
        CPI     71
        JZ      CDI             ;YES
        INX     D               ;NO, INCREMENT TIMEOUT TIMER
        IN      31H             ;IS COMPARATOR OUTPUT STILL
                                ;HIGH (DATA SIGNAL
                                ;STILL PRESENT)
        ANI     80H
        CPI     80H
        JZ      CDH             ;YES
CDI:    DI                      ;NO, DISABLE INTERRUPT SYSTEM
        SHLD    TEMP
        LXI     H,5             ;5 MSEC DELAY INSURES
                                ;THAT CAPACITOR HAS
                                ;DISCHARGED SUFFICIENTLY TO
                                ;PREVENT THE COMPARATOR
                                ;OUTPUT FROM RETURNING TO A
                                ;HIGH WHEN THE REFERENCE IS
                                ;DISABLED
```

```
        CALL    TIMER
        LHLD    TEMP
        MVI     A,20H        ;LEAVE CAPACITOR ON DISCHARGE
                             ;TO DISSIPATE ANY RESIDUAL
                             ;CHARGE WHILE RETURNING
                             ;THE SIGNAL SWITCHING PATH
                             ;TO NORMAL
        OUT     20H
        RET
CDX:    INX     H            ;INCREMENT THE INTERRUPT COUNTER
        JMP     CDG

DATA:   CALL    IWS2         ;COMPUTE TIME REMAINING IN
                             ;LEADING GUARD SIGNAL. THE
                             ;GUARD SIGNAL TRANSMISSION
                             ;WAS INITIATD IN THE "CD"
                             ;(CHARGE-DISCHARGE) ROUTINE
                             ;AT THE START OF THE DISCHARGE
                             ;INTERVAL.  THE TIME
                             ;REMAINING WILL BE 430 MSEC
                             ;MINUS THE LENGTH OF THE
                             ;DISCHARGE INTERVAL (TCORR)
        LXI     H,4300
        SHLD    WS2
        CALL    IWS1
        LHLD    TCORR
        SHLD    WS1
        LXI     H,WS1
        CALL    SUBT
        LXI     H,WS2        ;IS RESULT OF SUBT NEGATIVE
        INX     H
        INX     H
        INX     H
        MOV     A,M
        RAL
        JC      DATAC        ;YES
        CALL    IWS1         ;NO
        LXI     H,10
        SHLD    WS1
        CALL    IWS3
        LXI     H,WS1
        CALL    DIV
        LHLD    WS3          ;COMPLETE THE GUARD
                             ;TRANSMISSION
```

```
            CALL    TIMER
            JMP     DATAC
DATA1:      MVI     A,0DDH          ;SEND GUARD FOR 430 MSEC
            OUT     32H
            CALL    T1200
            LXI     H,430
            CALL    TIMER
DATAC:      LHLD    TCORR           ;IS "TCORR" GREATER THAN
                                    ;OR EQUAL TO 3 MSEC
                                    ;(MINIMUM DATA SIGNAL)
            LXI     D,-30
            DAD     D
            JC      DATAA           ;YES
            LXI     H,30            ;NO,SET "TCORR" TO
                                    ;MINIMUM DATA LENGTH
            SHLD    TCORR
DATAA:      LXI     H,DATAX         ;SETUP VARIABLE JUMP
            SHLD    ADDRS
            CALL    SET75           ;READY THE INTERRUPT SYSTEM
            LXI     H,200           ;SET HARDWARE TIMER TO
                                    ;200 MICRO SEC
            CALL    PULSE
            MVI     A,46H           ;STOP GUARD-START DATA
            OUT     21H
            EI                      ;ENABLE INTERRUPT SYSTEM
            LHLD    TCORR           ;PREPARE D,E,H,L REGISTERS
                                    ;TO ENTER "DATAX" WHEN THE
                                    ;FIRST INTERRUPT IS DETECTED
            XCHG
            LXI     H,-1
DATAB:      JMP     DATAB

DATAX:      DCX     D               ;IS THE DATA SIGNAL COMPLETE
            DAD     D
            JNC     DATAZ           ;YES
            LXI     H,-1            ;NO,RESET H,L REGISTERS
            EI
DATAY:      JMP     DATAY
DATAZ:      MVI     A,45H           ;STOP DATA-START GUARD
            OUT     21H
            LXI     H,50            ;DELAY FOR 50 MSEC
            CALL    TIMER
            MVI     A,0             ;STOP GUARD
            OUT     21H
            OUT     22H
            RET
```

```
COMP:   CALL    IWS1        ;LOAD "TMEAS" INTO "WS1"
        LHLD    TMEAS
        SHLD    WS1
        CALL    IWS2        ;LOAD "TA" INTO "WS2"
        LHLD    TA
        SHLD    WS2
        LXI     H,WS1       ;SUBTRACT WS2-WS1=WS2
        CALL    SUBT
        LXI     H,WS2       ;IS RESULT OF SUBTRACTION
                            ;NEGATIVE
        INX     H
        INX     H
        INX     H
        MOV     A,M
        RAL
        JC      COMPA       ;YES
        LXI     H,POS       ;NO, SET FLAG
                            ;INDICATING POSITIVE RESULT
        MVI     M,0
COMPC:  CALL    IWS1        ;LOAD "K1" INTO "WS1"
        LHLD    K1
        SHLD    WS1
        CALL    IWS3        ;MULTIPLY WS2*WS1=WS3
        LXI     H,WS1
        CALL    MULT
        CALL    IWS1        ;LOAD "TB" INTO "WS1"
        LHLD    TB
        SHLD    WS1
        CALL    IWS2        ;LOAD "TA" INTO "WS2"
        LHLD    TA
        SHLD    WS2
        LXI     H,WS1       ;SUBTRACT WS2-WS1=WS2
        CALL    SUBT
        CALL    IWS4        ;DIVIDE WS3/WS2=WS4
        LXI     H,WS2
        CALL    DIV
        CALL    IWS2        ;LOAD "K2" INTO "WS2"
        LHLD    K2
        SHLD    WS2
        CALL    IWS3        ;LOAD "K3" INTO "WS3"
        LHLD    K3
        SHLD    WS3
        LXI     H,WS2       ;ADD WS2+WS3=WS3
        CALL    ADDX
```

```
          CALL  IWS2      ;LOAD "K4" INTO "WS2"
          LHLD  K4
          SHLD  WS2
          LXI   H,WS2     ;SUBTRACT WS3-WS2=WS3
          CALL  SUBT
          LHLD  WS4       ;MOVE WS4 INTO WS2
          SHLD  WS2
          LHLD  WS4A
          SHLD  WS2A
          LXI   H,POS     ;WAS TA-TMEAS POSITIVE
          MOV   A,M
          CPI   0
          JNZ   COMPB     ;NO
          LXI   H,WS2     ;YES,SUBTRACT WS3-WS2=WS3
          CALL  SUBT
          LHLD  WS3
          LXI   H,WS3     ;IS RESULT OF SUBTRACTION
                          ;NEGATIVE
          INX   H
          INX   H
          INX   H
          RAL
          JC    COMPD     ;YES
          LHLD  WS3       ;NO,STORE RESULTS IN "TCORR"
          SHLD  TCORR
          RET
COMPB:    LXI   H,WS2     ;ADD WS2+WS3=WS3
          CALL  ADDX
          LHLD  WS3
          SHLD  TCORR
          RET

COMPD:    LXI   H,30      ;SEND MINIMUM MEASURE TIME
          SHLD  TCORR
          RET
COMPA:    LXI   H,POS     ;SET FLAG INDICATING
                          ;"TA-TMEAS" WAS NEGATIVE
          MVI   M,1
          CALL  IWS1      ;COMPUTE "TMEAS-TA"
          LHLD  TA
          SHLD  WS1
          CALL  IWS2
          LHLD  TMEAS
```

```
          SHLD    WS2
          LXI     H,WS1
          CALL    SUBT
          JMP     COMPC

SHIFT:    PUSH    H              ;SAVE H,L
          ORA     A              ;CLEAR CARRY FLAG
          MOV     A,M            ;FETCH BYTE 1 AND ROTATE
          RAL
          MOV     M,A
          INX     H              ;FETCH BYTE 2 AND ROTATE
          MOV     A,M
          RAL
          MOV     M,A
          INX     H              ;FETCH BYTE 3 AND ROTATE
          MOV     A,M
          RAL
          MOV     M,A
          INX     H              ;FETCH BYTE 4 AND ROTATE
          MOV     A,M
          RAL
          MOV     M,A
          POP     H              ;RECOVER H,L
          RET

MULT:     MVI     C,0            ;INITIAL PLACE CTR
MULTA:    INX     H
          INX     H
          INX     H
          MOV     A,M            ;IS MSB OF MULTIPLIER A ONE
          ANI     80H
          CPI     80H
          JZ      MULTB          ;YES
          DCX     H              ;NO,SHIFT MULTIPLIER LEFT
          DCX     H
          DCX     H
          CALL    SHIFT
          INR     C              ;INCREMENT PLACE CTR
          MOV     A,C            ;IS PLACE CTR 32----MULT BY ZERO
          CPI     32
          RZ                     ;YES
          JMP     MULTA          ;NO,TRY AGAIN
MULTB:    INX     H              ;ADD MULTIPLICAN TO
                                 ;PARTIAL PRODUCT
          CALL    ADDX
```

```
MULTC:  INR    C           ;INCREMENT PLACE CTR
        MOV    A,C         ;IS PLACE CTR 32
        CPI    32
        NOP
        NOP
        NOP
        RZ                 ;YES,MULTIPLICATION COMPLETE
        INX    H           ;NO,SHIFT PARTIAL PRODUCT
        INX    H
        INX    H
        INX    H
        CALL   SHIFT
        DCX    H           ;SHIFT MULTIPLIER
        DCX    H
        DCX    H
        DCX    H
        DCX    H
        DCX    H
        DCX    H
        DCX    H
        CALL   SHIFT
        INX    H           ;IS MSB IN MULTIPLIER A ONE
        INX    H
        INX    H
        MOV    A,M
        ANI    80H
        CPI    80H
        JZ     MULTB       ;YES
        INX    H           ;NO
        JMP    MULTC

DIV:    MVI    C,0         ;SET PLACE CTR TO ZERO
DIVA:   INX    H           ;LOCATE MSB OF DIVISOR
        INX    H
        INX    H
        MOV    A,M
        ANI    40H         ;IS NEXT MSB SET TO 1
        CPI    40H
        JZ     DIVB        ;YES
        DCX    H           ;NO,SHIFT DIVISOR
        DCX    H
        DCX    H
        CALL   SHIFT
```

```
            INR     C           ;INCREMENT PLACE CTR
            MOV     A,C         ;IS PLACE CTR AT 31
                                ;(DIVIDE-BY-ZERO)
            CPI     31
            RZ                  ;YES
            JMP     DIVA        ;NO,TRY AGAIN
DIVB:       DCX     H           ;SUBT DIVISOR FROM DIVIDEND--
                                ;RESULT IN DIVIDEND
            DCX     H
            DCX     H
            CALL    SUBT
            JC      DIVC        ;IS RESULTS NEGATIVE
                                ;YES
            INX     H           ;NO,SHIFT ANSWER LEFT ONE
            INX     H
            INX     H
            INX     H
            INX     H
            INX     H
            INX     H
            INX     H
            CALL    SHIFT
            MOV     A,M         ;SET LSB IN ANS TO ONE
            ORI     1
            MOV     M,A
DIVD:       DCX     H           ;SHIFT DIVIDEND LEFT ONE
            DCX     H
            DCX     H
            DCX     H
            CALL    SHIFT
            MOV     A,C         ;IS PLACE CTR ZERO
            CPI     0
            RZ                  ;YES,---DIVISION COMPLETE
            DCR     C           ;NO,DECREMENT PLACE CTR
            DCX     H
            JMP     DIVB
DIVC:       CALL    ADDX        ;ADD DIVISOR TO DIVIDEND
            INX     H
            INX     H
            INX     H
            INX     H
            INX     H
            INX     H
            INX     H
            INX     H
```

```
            CALL    SHIFT           ;SHIFT ANSWER
            MOV     A,M             ;SET LSB IN ANS TO ZERO
            ANI     ØFEH
            MOV     M,A
            JMP     DIVD

ADDX:       PUSH    H               ;SAVE H,L
            MVI     B,Ø             ;CLEAR "PASS COUNTER"
            ORA     A               ;CLEAR "CARRY FLAG"
ADDA:       MOV     A,M             ;ADD FIRST NEXT BYTE PAIR
            INX     H
            INX     H
            INX     H
            INX     H
            ADC     M
            MOV     M,A
            PUSH    PSW             ;SAVE "FLAG REGISTER"
            INR     B               ;IS THIS THE LAST BYTE PAIR
                                    ;TO BE ADDED
            MOV     A,B
            CPI     4
            JZ      ADDB            ;YES
            POP     PSW             ;NO, RECOVER "FLAG REGISTER"
            DCX     H               ;ADD NEXT BYTE PAIR
            DCX     H
            DCX     H
            JMP     ADDA
ADDB:       POP     PSW             ;RECOVER "CARRY FLAG"
            POP     H               ;RECOVER "H,L"
            RET

SUBT:       PUSH    H               ;SAVE H,L
            MVI     B,Ø             ;CLEAR "PASS COUNTER"
            ORA     A               ;CLEAR "BORROW FLAG"
            INX     H
            INX     H
            INX     H
            INX     H
```

```
SUBTA:   MOV    A,M         ;SUBTRACT FIRST/NEXT
                            ;BYTE PAIR
         DCX    H
         DCX    H
         DCX    H
         DCX    H
         SBB    M
         INX    H
         INX    H
         INX    H
         INX    H
         MOV    M,A         ;STORE RESULTS
         PUSH   PSW         ;SAVE "FLAG REGISTER"
         INR    B           ;IS THIS THE LAST BYTE PAIR
         MOV    A,B
         CPI    4
         JZ     SUBTB       ;YES
         POP    PSW         ;NO,RECOVER "FLAG REGISTER"
         INX    H           ;SUBT NEXT BYTE PAIR
         JMP    SUBTA
SUBTB:   POP    PSW         ;RECOVER "CARRY FLAG"
         POP    H           ;RECOVER "H,L"
         RET

IWS1:    LXI    H,WS1       ;CLEAR WORK SPACE 1
         JMP    IWSA
IWS2:    LXI    H,WS2       ;CLEAR WORK SPACE 2
         JMP    IWSA
IWS3:    LXI    H,WS3       ;CLEAR WORK SPACE 3
         JMP    IWSA
IWS4:    LXI    H,WS4       ;CLEAR WORK SPACE 4
         JMP    IWSA
IWS5:    LXI    H,WS5       ;CLEAR WORK SPACE 5
IWSA:    PUSH   H           ;SAVE H,L
         MVI    A,1
IWSC:    MVI    M,0
         CPI    4           ;IS THIS THE LAST LOCATION
         JZ     IWSB        ;YES
         INR    A           ;NO,INCREMENT LOCATION CTR
         INX    H
         JMP    IWSC
IWSB:    POP    H           ;RECOVER H
         RET
```

```
MWT0:    LXI    H,1992      ;SETUP HARDWARE TIMER
         CALL   SQWAV
         MVI    A,4H        ;SETUP TONE PATH
         OUT    21H
         MVI    A,23H
         OUT    22H
         RET

MWT15:   LXI    H,1992      ;SETUP HARDWARE TIMER
         CALL   SQWAV
         MVI    A,44H
         OUT    21H
         MVI    A,21H
         OUT    22H
         RET

SQWAV:   MVI    B,40H
         JMP    PULSA
PULSE:   MVI    B,0C0H
PULSA:   MOV    A,L         ;SETUP TIMER REGISTERS
         OUT    34H
         MOV    A,H
         ORA    B
         OUT    35H
         MVI    A,42H       ;STOP TIMER
         OUT    30H
         MVI    A,0C2H      ;RESTART TIMER
         OUT    30H
         RET

SET75:   MVI    A,42H       ;STOP TIMER
         OUT    30H
         MVI    A,1BH       ;RESET AND ENABLE RST75
         DB     30H         ;"SIM" INSTRUCTION
         RET

TIMER:   MOV    A,H         ;DOES H=0
         CPI    0
         JNZ    TIMEA       ;NO
         MOV    A,L         ;YES, DOES L=0
         CPI    0
         CPI    0
         JNZ    TIMEB       ;NO
         RET                ;YES
```

```
TIMEA:   MOV   A,L
         MOV   A,L
         CPI   0
         JMP   TIMEB
TIMEB:   MVI   A,C2      ;EXECUTE LOOP C2 TIMES
TIMEC:   CPI   0
         JZ    TIMED
         DCR   A
         JMP   TIMEC
TIMED:   JMP   TIMEE
TIMEE:   DCX   H         ;DECREMENT TIME COUNTER
         JMP   TIMER

ORG   3000H
JUMP     DB    0C3H      ;VARIABLE JUMP STATEMENT
ADDRS    DS    2

C1L0     DS    2         ;ALIGNMENT CONSTANT 0 DBM
C1L15    DS    2         ;ALIGNMENT CONSTANT -10 DBM

K1       DS    2         ;CONVERSION EQUATION CONSTANTS
K2       DS    2
K3       DS    2
K4       DS    2
TA       DS    2
TB       DS    2
TMEAS    DS    2
TCORR    DS    2
POS      DS    1

WS1      DS    2         ;ARITHMETIC ROUTINES
WS1A     DS    2
WS2      DS    2
WS2A     DS    2
WS3      DS    2
WS3A     DS    2
WS4      DS    2
WS4A     DS    2
WS5      DS    2
WS5A     DS    2
BUF      DS    100
         END   0000H
```

I claim:

1. A signal compensation arrangement (FIG. 1) comprising,
   means (104) for measuring the amplitude of supplied signals,
   a source of a reference signal (111),
   means (SW1-SWN, 108, 112, 113, 103) for controllably supplying (via 105) said reference signal at a plurality of prescribed amplitudes (via A1-AN) to said amplitude measuring means (104),
   means (101, 102, 103) for controllably supplying (via 105) an incoming test signal (via T,R) to said amplitude measuring means (104), and
   control means (105) for utilizing amplitude values of said plurality of reference signal amplitudes (from 104) and of said incoming test signal amplitude (from 104) to generate a version of said incoming test signal amplitude compensated for measurement system inaccuracies and nonlinearities.

2. An arrangement as defined in claim 1 wherein said control means (105) includes means (FIG. 3) for converting said amplitude values into binary numbers, means for storing said binary numbers (RAM 303) and means (301, 302, 303, 304 etc.) for utilizing said stored binary numbers in conjunction with prescribed constants in a first prescribed compensation process to generate said compensated version (TCORR) of said test signal amplitude.

3. A signal compensation arrangement (FIG. 1) comprising,
   means (104) for measuring the amplitude of supplied signals,
   a source of a reference signal (111),
   means (SW1-SWN, 108, 112, 113, 103) for controllably supplying (via 105) said reference signal at a plurality of prescribed amplitudes (via A1-AN) to said amplitude measuring means (104),
   means (101, 102, 103) for controllably supplying (via 105) an incoming test signal (via T,R) to said amplitude measuring means (104), and
   control means (105) including means (FIG. 3) for converting amplitude values of said plurality of reference signal amplitudes (from 104) and of said incoming test signal amplitude (from 104) into binary numbers, means for storing said binary numbers (303) and means (301, 302, 303, 304, etc.) for utilizing said stored binary numbers in conjunction with prescribed constants in a first prescribed ompensation process to generate a version of said incoming test signal amplitude compensated for measurement system inaccuracies and nonlinearities,
   said control means (105) further generates control signals for controlling said reference signal source (111) to supply a signal at a predetermined frequency, controlling said means (SW1, SW2, etc.) to supply the reference signal at first and second predetermined amplitude values (via A, SW1 and A2, SW2, 112, 113) to said amplitude measuring means (104), and controlling said means to supply (101, 102) said incoming test signal to said amplitude measuring means (104).

4. A signal compensation arrangement (FIG. 1) comprising,
   means (104) for measuring the amplitude of supplied signals,
   a source of a reference signal (111),
   means (SW1-SWN, 108, 112, 113, 103) for controllably supplying (via 105) said reference signal at prescribed amplitudes (via A1-AN) to said amplitude measuring means (104),
   means (101, 102, 103) for controllably supplying (via 105) an incoming test signal (via T, R) to said amplitude measuring means (104), and
   control means (105) utilizing amplitude values of said reference signal amplitudes (from 104) and of said incoming test signal amplitude (from 104) for generating a compensated amplitude version of said test signal in accordance with the compensation process $$TCORR = K - \frac{K_1 (TA - TMEAS)}{TA - TB}$$

where TCORR is the compensated amplitude of said test signal, K and $K_1$ are prescribed constants dependent on a test being run, TA is a first reference signal amplitude, TB is a second reference signal amplitude and TMEAS is the amplitude of an incoming test signal.

5. A signal compensation arrangement (FIG. 1) comprising,
   means (104) for measuring the amplitude of supplied signals,
   a source of a reference signal (111),
   means (SW1-SWN, 108, 112, 113, 103) for controllably supplying (via 105) said reference signal at a plurality of prescribed amplitudes (via A1-AN) to said amplitude measuring means (104),
   means (101, 102, 103) for controllably supplying (via 105) an incoming test signal (via T,R) to said amplitude measuring means (104), and
   control means (105) including a central processor unit (CPU 302) having a plurality of working registers, clock means (301) for supplying a timing signal at a predetermined frequency to the central processor unit (302), read-write memory (RAM 303), input-/output (I/O 305), bus (306) and read only memory (ROM 304) having a set of instructions (FIGS. 4-8) stored therein for controlling the control means (105) to generate control signals for individually supplying at least a first reference signal (TA from 111 via A1, SW1, etc.) having a first prescribed amplitude to said amplitude measuring means (104), a second reference signal (TB via A2, SW2 etc.) having a second prescribed amplitude to said amplitude measuring means (104) and an incoming test signal (TMEAS via T, R, 111, 112) to said amplitude measuring means (104), for controlling said amplitude measuring means (104) to measure individually the amplitude of said first reference signal (TA), said second reference signal (TB) and said test signal (TMEAS), and for utilizing said measured amplitudes in a first prescribed compensation process to generate a compensated version (TCORR) of said test signal amplitude (TMEAS).

6. A signal compensation arrangement (FIG. 1) comprising,
   means (104) for measuring the amplitude of supplied signals,
   a source of a reference signal (111),
   means (SW1-SWN, 108, 112, 113, 103) for controllably supplying (via 105) said reference signal at prescribed amplitudes (via A1-AN) to said amplitude measuring means (104), means (101, 102, 103) for controllably supplying (via 105) an incoming test signal (via T,R) to said amplitude measuring means (104), and control means (105) including a central processor unit (CPU 302) having a plurality of working registers, clock means (301) for supplying a timing signal at a predetermined frequency to the central processor unit (302), read-write memory (RAM 303), input/output (I/O 305), bus (306) and read only memory (ROM 304) having a set of instructions (FIGS. 4–8) for controlling the control means (105) to generate control signals for individually supplying at least a first reference signal (TA from 111 via A1, SW1, etc.) having a first prescribed amplitude to said amplitude measuring means (104), a second reference signal (TB via A2, SW2, etc.) having a second prescribed amplitude to said amplitude measuring means (104) and an incoming test signal (TMEAS via T, R, 111, 112) to said amplitude measuring means (104), for controlling said amplitude measuring means (104) to measure individually the amplitudes of said first reference signal (TA), said second reference signal (TB) and said test signal (TMEAS), and for controlling said control means (105) to utilize said measured amplitudes in a first prescribed compensation process having the form $$TCORR = K - \frac{K_1 (TA - TMEAS)}{TA - TB}$$

where TCORR is the compensated amplitude of said test signal, K and $K_1$ are prescribed constants dependent on a test being run, TA is a first reference signal amplitude, TB is a second reference signal amplitude and TMEAS is the amplitude of an incoming test signal.

7. A signal amplitude measurement system (FIG. 1) comprising, means (104) for measuring amplitudes of supplied signals, a source (111, A1-AN) of a plurality of reference signals (for example TA, TB) each having a predetermined amplitude, means (111, SW1-SWN) responsive to control signals (from 105) for individually supplying (via 108, 112, 113, 103) said plurality of reference signals (TA, TB) to said amplitude measuring means (104), means (101, 102) responsive to control signals (from 105) for supplying an incoming test signal (TMEAS) to said amplitude measuring means (104), and control means (105) for generating said control signals and including means (FIG. 3) for using amplitude values of said plurality of reference signals (TA, TB) and an amplitude value (TMEAS) of said incoming test signal in a prescribed compensation process (FIGS. 4–8) to generate a version (TCORR) of said test signal amplitude value compensated for measurement system inaccuracies and nonlinearities.

8. A signal amplitude measurement system as defined in claim 7 wherein said amplitude measuring means (104) includes means (FIG. 2, 105-210) for converting amplitude values of said supplied signals to pulse signals having widths proportional to said amplitude values, and wherein said control means (105) includes means (FIG. 3 CPU 302, etc.) for converting said reference pulse signal widths into binary numbers, means (RAM 303) for storing said binary numbers and means (CPU 302, etc.) for utilizing said stored binary numbers in said compensation process.

9. A signal amplitude measurement system (FIG. 1) comprising, means (104) for measuring the amplitudes of supplied signals and including means (FIG. 2, 205-210) for converting amplitude values of said supplied signals to pulse signals having widths proportional to said amplitude values, a source (111, A1-AN) of a plurality of reference signals (for example TA, TB) each having a predetermined amplitude, means (111, SW1-SWN) responsive to control signals (from 105) for individually supplying (via 108, 112, 113, 103) said plurality of reference signals (TA, TB) to said amplitude measuring means (104, FIG. 2, 205-210), means (101, 102) responsive to control signals (from 105) for supplying an incoming test signal (TMEAS) to said amplitude measuring means (104, FIG. 2, 205-210), and control means (105) for generating said control signals and including means (FIG. 3, CPU 302, etc.) for converting said reference pulse signal widths into binary numbers, means (RAM 303) for storing said binary numbers and means for utilizing said stored binary numbers and an amplitude value of said incoming test signal in a prescribed compensation process (FIGS. 4–8) to generate a version (TCORR) of said test signal amplitude value compensated for measurement system inaccuracies and nonlinearities, said control means (105) further includes means (ROM 304) for storing a set of instructions for causing said control means (105) to affect said amplitude compensation process by controllably individually supplying (via SW1, SW2) first and second reference signals (TA and TB) from said reference signal source (111, A1, A2) to said amplitude measuring means, controlling said amplitude measuring means (104) to generate individually first and second pulse signals (via 205-210) having widths proportional to the measured amplitudes of said first and second reference signals, respectively, converting the widths of said first and second reference pulse signals into binary numbers and storing the first and second binary reference numbers (in RAM 303), controllably supplying an incoming test signal (TMEAS via T, R, 101, 102) to said amplitude measuring means (104), controlling said amplitude measuring means (104) to generate a test pulse signal having a width (via 205-210) proportional to the measured amplitude of said test signal (TMEAS), converting the width of said test pulse signal into a binary number and utilizing said reference binary members (TA, TB) and said test binary number (TMES) in said prescribed compensation process.

10. A signal amplitude measurement system (FIG. 1) comprising, amplitude measuring means (104, FIG. 2, 205-210) for converting amplitude values of supplied signals to pulse signals having widths proportional to said amplitude values, a source (111, A1-AN) of a plurality of reference signals (for example TA, TB) each having a predetermined amplitude, means (111, SW1-SWN) responsive to control signals (from 105) for individually supplying (via 108, 113, 113, 103) said plurality of reference signals (TA, TB) to said amplitude measuring means (104, FIG. 2, 205–210), means (101, 102) responsive to control signals (from 105) for supplying an incoming test signal (TMEAS) to said amplitude measuring means (104, FIG. 2, 205–210), and control means (105) for generating said control signals and including means (FIG. 3, CPU 302, etc.) for converting said reference pulse signal widths into binary numbers, means (RAM 303) for storing said binary numbers and means for utilizing said stored binary numbers and an amplitude value of said incoming test signal in a prescribed compensation process (FIGS. 4–8) to generate a version (TCORR) of said test signal amplitude value compensated for measurement system inaccuracies and nonlinearities, said prescribed compensation process is $$TCORR = K - \frac{K_1(TA - TMEAS)}{TA - TB}$$

where TCORR is the compensated amplitude of said test signal, K and $K_1$ are prescribed constants dependent on a test being run, TA is a first reference signal amplitude, TB is a second reference signal amplitude and TMEAS is the amplitude of an incoming test signal.

* * * * *